(12) United States Patent
Kim et al.

(10) Patent No.: US 7,535,031 B2
(45) Date of Patent: May 19, 2009

(54) SEMICONDUCTOR LIGHT EMITTING DEVICE WITH LATERAL CURRENT INJECTION IN THE LIGHT EMITTING REGION

(75) Inventors: James C. Kim, San Jose, CA (US); Stephen A. Stockman, Morgan Hill, CA (US)

(73) Assignee: Philips Lumiled Lighting, Co. LLC, San Jose, CA (US)

( * ) Notice: Subject to any disclaimer, the term of this patent is extended or adjusted under 35 U.S.C. 154(b) by 270 days.

(21) Appl. No.: 11/226,184

(22) Filed: Sep. 13, 2005

(65) Prior Publication Data

US 2007/0057249 A1 Mar. 15, 2007

(51) Int. Cl.
*H01L 27/15* (2006.01)

(52) U.S. Cl. .................. 257/101; 257/E27.12

(58) Field of Classification Search .......... 257/9, 257/12, 13, 14, 15, 16, 17, 18, 19, 79, 101, 257/102, 103, E27.12; 438/22, 29, 42, 43, 438/44, 45, 46, 47
See application file for complete search history.

(56) References Cited

U.S. PATENT DOCUMENTS

| | | | | |
|---|---|---|---|---|
| 4,644,553 A | * | 2/1987 | Van Ruyven et al. | 372/45.01 |
| 4,683,484 A | * | 7/1987 | Derkits, Jr. | 257/20 |
| 5,815,522 A | * | 9/1998 | Nagai | 372/46.016 |
| 6,055,460 A | * | 4/2000 | Shopbell | 700/121 |
| 6,144,043 A | * | 11/2000 | Ogihara et al. | 257/88 |
| 6,187,684 B1 | * | 2/2001 | Farber et al. | 438/704 |
| 6,329,667 B1 | * | 12/2001 | Ota et al. | 257/13 |
| 6,437,374 B1 | * | 8/2002 | Northrup et al. | 257/103 |
| 2002/0110945 A1 | * | 8/2002 | Kuramata et al. | 438/36 |

OTHER PUBLICATIONS

Takashi Mukai et al., "Ultraviolet InGaN and GaN Single-Quantum-Well-Structure Light-Emitting Diodes Grown on Epitaxially Laterally Overgrown GaN Substrates," Jpn. J. Appl. Phys. vol. 38, Part 1, No. 10, Oct. 1999, pp. 5735-5739.

* cited by examiner

*Primary Examiner*—Evan Pert
*Assistant Examiner*—Kevin Quinto
(74) *Attorney, Agent, or Firm*—Rachel Leiterman; Patent Law Group

(57) ABSTRACT

A semiconductor light emitting device includes an active region, an n-type region, and a p-type region comprising a portion that extends into the active region. The active region may include multiple quantum wells separated by barrier layers, and the p-type extension penetrates at least one of the quantum well layers. The extensions of the p-type region into the active region may provide uniform filling of carriers in the individual quantum wells of the active region by providing direct current paths into individual quantum wells. Such uniform filling may improve the operating efficiency at high current density by reducing the carrier density in the quantum wells closest to the bulk p-type region, thereby reducing the number of carriers lost to nonradiative recombination.

14 Claims, 5 Drawing Sheets

SEMICONDUCTOR LIGHT EMITTING DEVICE WITH LATERAL CURRENT INJECTION IN THE LIGHT EMITTING REGION

BACKGROUND

1. Field of Invention

This invention relates to the light emitting region of a semiconductor light emitting device.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

Needed in the art are III-nitride light emitting devices that operate efficiently at high current density.

SUMMARY

In accordance with embodiments of the invention, a semiconductor light emitting device includes an active region, an n-type region, and a p-type region comprising a portion that extends into the active region. In some embodiments, the active region includes multiple quantum wells separated by barrier layers, and the p-type extension penetrates at least one of the quantum well layers. In some embodiments the p-type region includes multiple portions that extend into the active region, and the extensions have a minimum width of 250 nm and are spaced between 0.3 and ten microns apart.

In some embodiments, the extensions of the p-type region into the active region provide uniform filling of carriers into multiple quantum wells of the active region by providing direct hole injection paths into individual quantum wells. Such uniform filling of multiple quantum wells may improve the operating efficiency at high current density by reducing the carrier density in the quantum wells closest to the bulk p-type region, thereby reducing the number of carriers lost to nonradiative recombination.

BRIEF DESCRIPTION OF THE DRAWINGS

FIG. 1 illustrates a III-nitride light emitting device.

FIG. 2 illustrates a portion of the valence band for the device of FIG. 1.

FIGS. 3-5 illustrate portions of devices according to embodiments of the invention.

FIG. 6 illustrates an alternate method of producing the device illustrated in FIG. 5.

FIGS. 7 and 8 are a plan view and a cross sectional view of a large junction flip chip light emitting device.

FIG. 9 illustrates a thin film light emitting device.

FIG. 10 is an exploded view of a packaged light emitting device.

DETAILED DESCRIPTION

FIG. 1 illustrates a common III-nitride light emitting device. An n-type region 11 is grown over a sapphire substrate 10. An active region 12, which may include multiple quantum wells separated by barrier layers, is grown over n-type region 11, followed by a GaN spacer layer 13, a p-type AlGaN layer 14, and a p-type contact layer 15.

As the current density applied to the device of FIG. 1 increases, the internal quantum efficiency of the device, defined as the ratio of the flux of photons generated to the flux of carriers supplied, initially increases, then decreases. The design of the device of FIG. 1 may result in nonradiative recombination, which may cause or contribute to the decrease in internal quantum efficiency at high current density.

FIG. 2 illustrates a portion of the valence band of the device of FIG. 1. FIG. 2 illustrates three quantum well layers, 12*a*, 12*b*, and 12*c*, separated by barriers. Holes do not readily diffuse in p-type III-nitride layers, thus in the device illustrated in FIG. 2, quantum well 12*a*, the quantum well located closest to p-type layers 14 and 15, is expected to have the highest hole density of the quantum wells. Quantum well 12*c*, the quantum well located furthest from p-type layers 14 and 15, is expected to have the lowest hole density of the quantum wells. Quantum well 12*a* may be overfilled with carriers, in particular as current density increases, resulting in a significant number of carriers lost to nonradiative processes. In contrast, quantum well 12*c* may be underfilled to the extent that it does have enough carriers available to recombine to make a significant contribution to the amount of light emitted by the device.

In accordance with embodiments of the invention, the active region of a light emitting device includes structures to more uniformly distribute carriers among the quantum wells. Even distribution of carriers among the quantum wells may reduce the number of carriers lost to nonradiative recombination by reducing the carrier density of the quantum wells closest to the p-type region of the device. Embodiments of the invention include p-type layers that extend into the active region, to provide direct, lateral injection of carriers into individual quantum wells.

FIG. 3 illustrates a portion of a device according to a first embodiment of the invention. The device of FIG. 3 includes an active region 31 sandwiched between an n-type region 30 and a p-type region 36. Active region 31 includes multiple quantum wells 32 separated by barrier layers 34. Quantum wells 32 may be between 10 and 100 or more angstroms thick, and often have a thickness between 20 and 40 angstroms. Barrier layers 34 may be between 20 and 500 angstroms thick, and often have a thickness between 60 and 130 angstroms. Though three quantum wells are illustrated in FIG. 3, it is to be understood that the device may include more or fewer quantum wells.

P-type region 36 includes p-type extensions 38 that extend into active region 31. Holes may diffuse vertically downward into active region 31 through the interface of p-type region 36 and the top quantum well. In addition, holes may diffuse vertically downward into extensions 38, then horizontally from extensions 38 into quantum wells 32. Extensions 38 thus deliver holes to quantum wells 32 via direct, vertical electrical paths from p-type region 36. The horizontal diffusion of holes from extensions 38 to quantum wells 32 may provide uniform filling of the quantum wells with holes.

Figure 1:
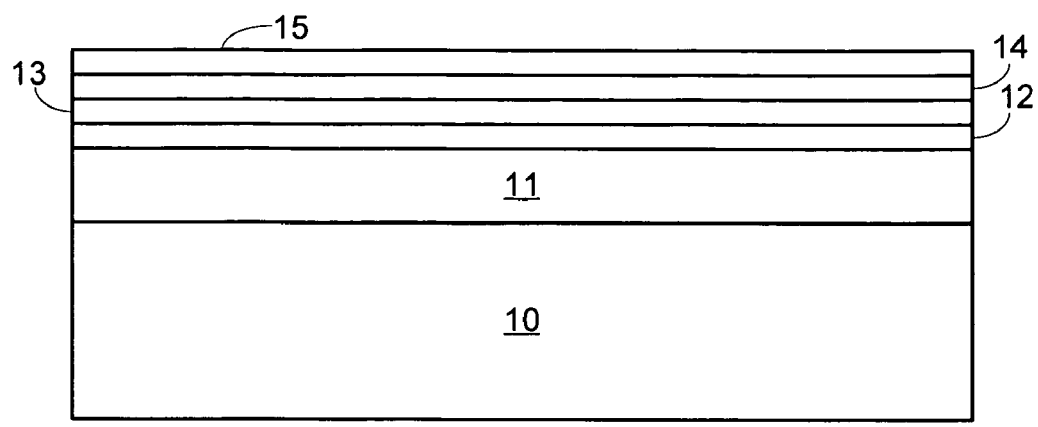
Figure 2:
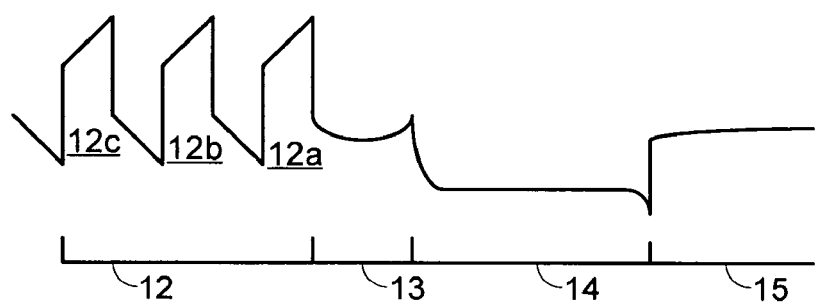
Figure 3:
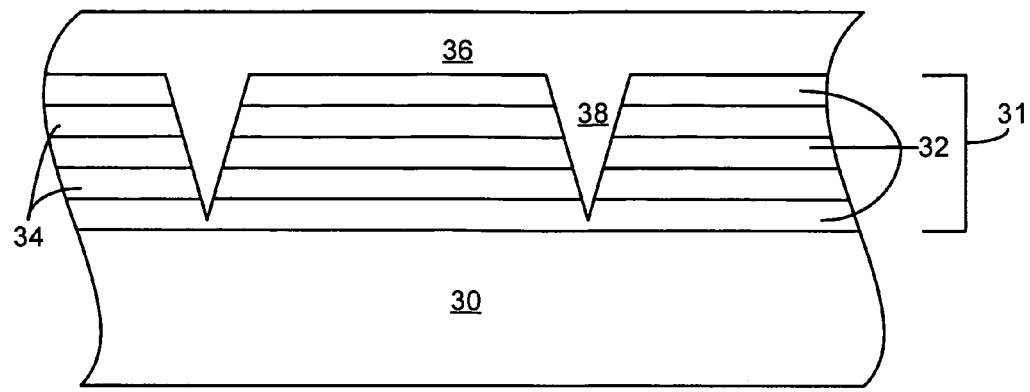

III-nitride devices are generally grown on substrates such as sapphire and SiC which have a lattice mismatch with the III-nitride layers making up the device. This mismatch often causes defects in the crystalline III-nitride layers. In the device of FIG. 3, extensions 38 may be formed in defects or dislocations in the crystal, such as pit defects or threading dislocations, which extend from p-type region 36 into active region 31. Such pits may begin in n-type region 30. N-type region 30 and active region 31 may be grown in conditions that encourage pit formation. For example, growth at reduced temperature such as temperatures less than 900° C., at reduced ammonia concentration, and/or at a fast growth rate such as growth rates greater than 0.7 Å/second may encourage the formation of pits.

Pit defects that form p-type extensions 38 are spaced at a density between about $10^6$ cm$^{-2}$ and about $10^9$ cm$^{-2}$, more preferably between about $10^7$ cm$^{-2}$ and about $10^8$ cm$^{-2}$, corresponding to an average pit spacing between about 0.3 and 10 microns, more preferably between 1 and 3 microns. The number of pit defects may be controlled by controlling the dislocation density in active region 31. Achieving the above-described pit densities may require growth techniques which may reduce the dislocation density, such as epitaxial lateral overgrowth, hydride vapor phase epitaxy, and growth on freestanding GaN substrates. Epitaxial lateral overgrowth involves selective growth of GaN over openings in a mask layer formed on GaN layer grown on a conventional growth substrate such as sapphire. The coalescence of the selectively-grown GaN may enable the growth of a flat GaN surface over the entire growth substrate. Layers grown subsequent to the selectively-grown GaN layer may exhibit low dislocation densities. Epitaxial lateral overgrowth is described in more detail in Mukai et al., "Ultraviolet InGaN and GaN Single-Quantum Well-Structure Light-Emitting Diodes Grown on Epitaxial Laterally Overgrown GaN Substrates," Jpn. J. Appl. Phys. Vol. 38 (1999) p. 5735, which is incorporated herein by reference. Hydride vapor phase epitaxial growth of freestanding GaN substrates is described in more detail in Motoki et al., "Preparation of Large Freestanding GaN. Substrates by Hydride Vapor Phase Epitaxy Using GaAs as a Starting Substrate," Jpn. J. Appl. Phys. Vol. 40 (2001) p. L140, which is incorporated herein by reference.

The depth and top diameter of pit defects that form p-type extensions 38 depend on the depth of active region 31, as pit defects generally grown in an inverted-cone shape. The pit defects that form p-type extensions 38 must be deep enough to penetrate at least two quantum wells, and often have a depth between 200 and 600 nm. For example, at an active region depth of 400 nm, the pit defects have a depth of about 400 nm and a top diameter of about 250 nm.

In some embodiments, after growth of active region 31, existing pits may be etched to enlarge the pits sufficiently to permit p-type material to be grown in the pits in a subsequent p-type material growth step. For example, the pits may be enlarged by etching with HCl. P-type region 36 is then grown over active region 31, in conditions that cause p-type region 36 to fill in the pit defects to form extensions 38. For example, 1-type region 36 may be grown at increased temperature, at increased ammonia concentration, and/or at a slow growth rate, which conditions favor filling in the pit defects with p-type material.

Figure 4:
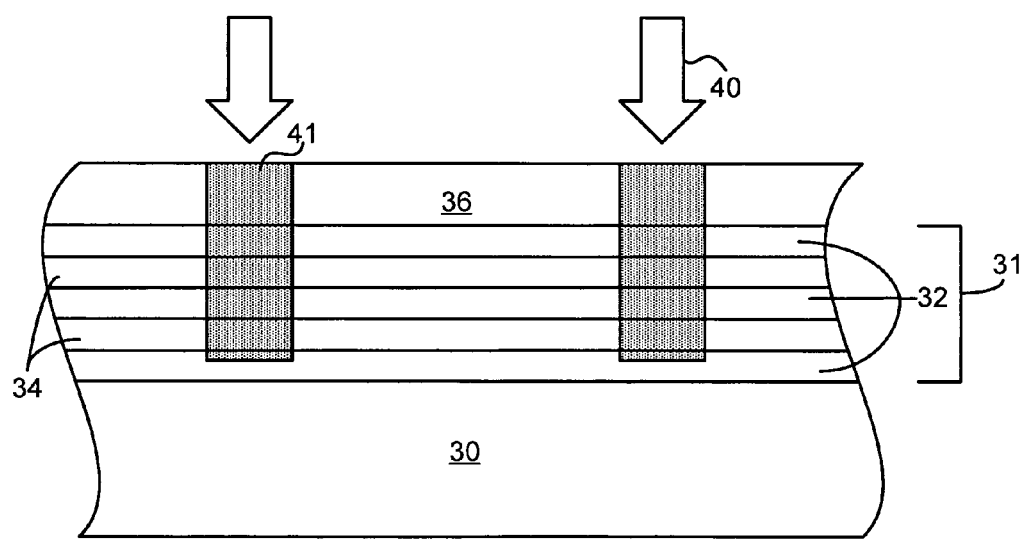

FIG. 4 illustrates a portion of a device according to a second embodiment of the invention. In the device illustrated in FIG. 4, p-type extensions 41 into active region 31 are formed after growth of the active region. A p-type dopant such as Mg or any other suitable dopant is vertically diffused or implanted 40 into portions 41 of active region 31 to make these portions p-type. Portions 41 may be less than one micron in diameter, may be spaced at least 0.1 micron from adjacent implanted or diffused portions 41, and are often spaced between one and three microns from adjacent portions 41. Mg may be implanted at elevated temperature, for example at least 250° C., in order to promote healing of crystal damage caused by the implant. Implantation may be performed before or after growth of p-type region 36. The device may be annealed after implantation, for example at a temperature between 700 and 900° C. to encourage downward vertical diffusion of the p-type dopants into active region 31. The impact of lateral diffusion during the anneal can be minimized by spacing the implantation regions further apart than the depth of the implantation regions, and by limiting the time of the anneal. In some embodiments, the regions between portions 41 may be implanted with a material to retard movement of the p-type dopant implanted or diffused in portions 41, such as, for example, oxygen. As in the device of FIG. 3, holes may diffuse into active region 31 through the interface of p-type region 36 and the top quantum well, or holes may diffuse into extensions 41, then horizontally from extensions 41 into quantum wells 32.

Figure 5:
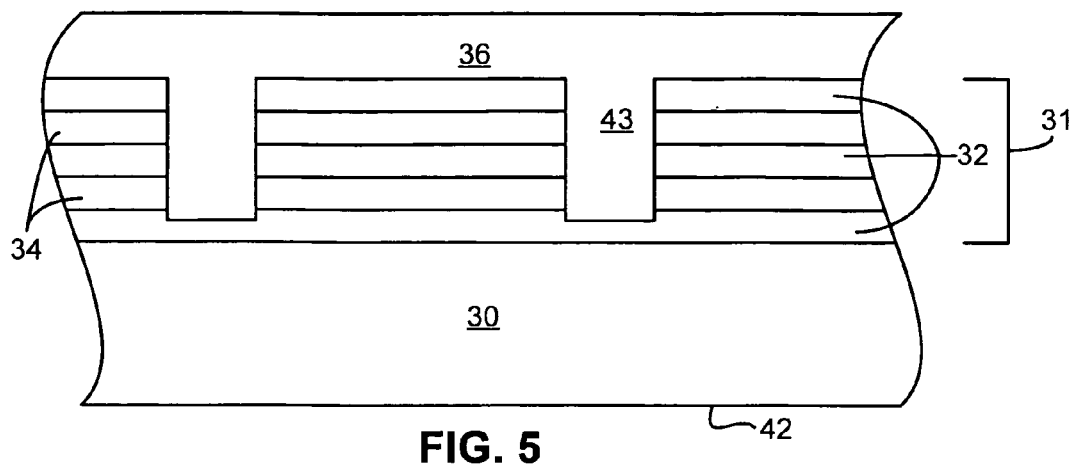

FIG. 5 illustrates a portion of a device according to a third embodiment of the invention. In the device of FIG. 5, p-type extensions 43 fill portions of active region 31 that are etched away or selectively grown. The device of FIG. 5 may be formed by growing n-type region 30 on a growth substrate, such that surface 42 of n-type region 30 is grown first. Active region 31, including alternating quantum well layers 32 and barrier layers 34, is then grown over n-type region 30. The wafer is then patterned and etched to remove portions 43 of the active region. Portions 43 may be less than one micron in diameter, may be spaced at least 0.1 micron from adjacent etched portions 43, and are often spaced between one and three microns from adjacent portions 43. P-type region 36 is then grown such that portions 43 are filled in with p-type material, as described above in reference to FIG. 3.

Figure 6:
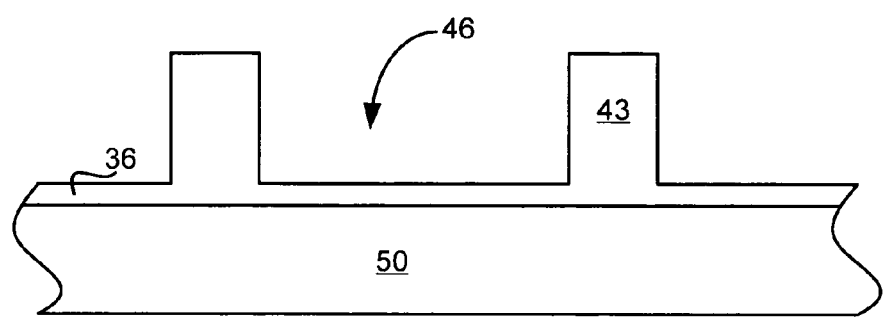

FIG. 6 illustrates an alternate method for producing the device illustrated in FIG. 5. In FIG. 6, a p-type region 36 is grown first on a conventional growth substrate 50, before the n-type region. The p-type region is then patterned and etched to remove portions 46, leaving posts 43. Active region 31 is then grown over p-type region 36, filling in portions 46. N-type region 30 is grown over active region 31, resulting in the device illustrated in FIG. 5.

Several factors influence the size and spacing of the p-type extensions into the active region, including the average lateral diffusion length of a hole in a quantum well and the current-carrying capacity of the extensions. In a preferred embodiment, the extensions are small, on the order of 250 to 500 nm wide, and spaced about 1 to 2 microns apart.

In the above examples, three quantum wells are illustrated. In some embodiments, it is preferable to include more quantum wells. In some embodiments, the different quantum well layers may have different compositions, such that they emit different wavelengths of light when the device is forward biased.

In some embodiments, it is desirable to favor horizontal current injection into the quantum wells through the extensions of the p-type regions, over vertical current injection into the quantum wells through the horizontal interface between the p-type region and the active region. This may be accomplished by providing a lower forward voltage and smaller series resistance across the vertical interfaces between the p-type extensions and the quantum wells, than across the horizontal interface between the p-type region and the active region. For example, a thick undoped GaN layer or layer of higher band gap such as AlGaN, which restrict current flow, may be provided in the portions of the p-type region between the p-type extensions, or the portions of the p-type region between the extensions may be eliminated such that the only p-type material in the device is in the extensions, or a semiconductor layer that is not intentionally doped, that has a dopant concentration less than a dopant concentration in the p-type region, or that has a band gap greater than a band gap in the p-type region may be formed over the portions of the p-type region between the p-type extensions. In some embodiments, a barrier may be disposed between the p-type region and the active region in areas where there is no extension of the p-type region. The barrier would prevent or reduce the number of holes diffusing into the active region outside the extensions.

Figure 9:
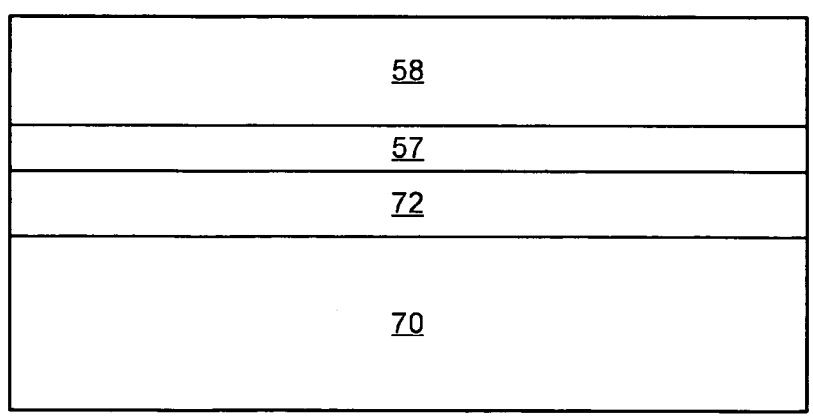
Figure 7:
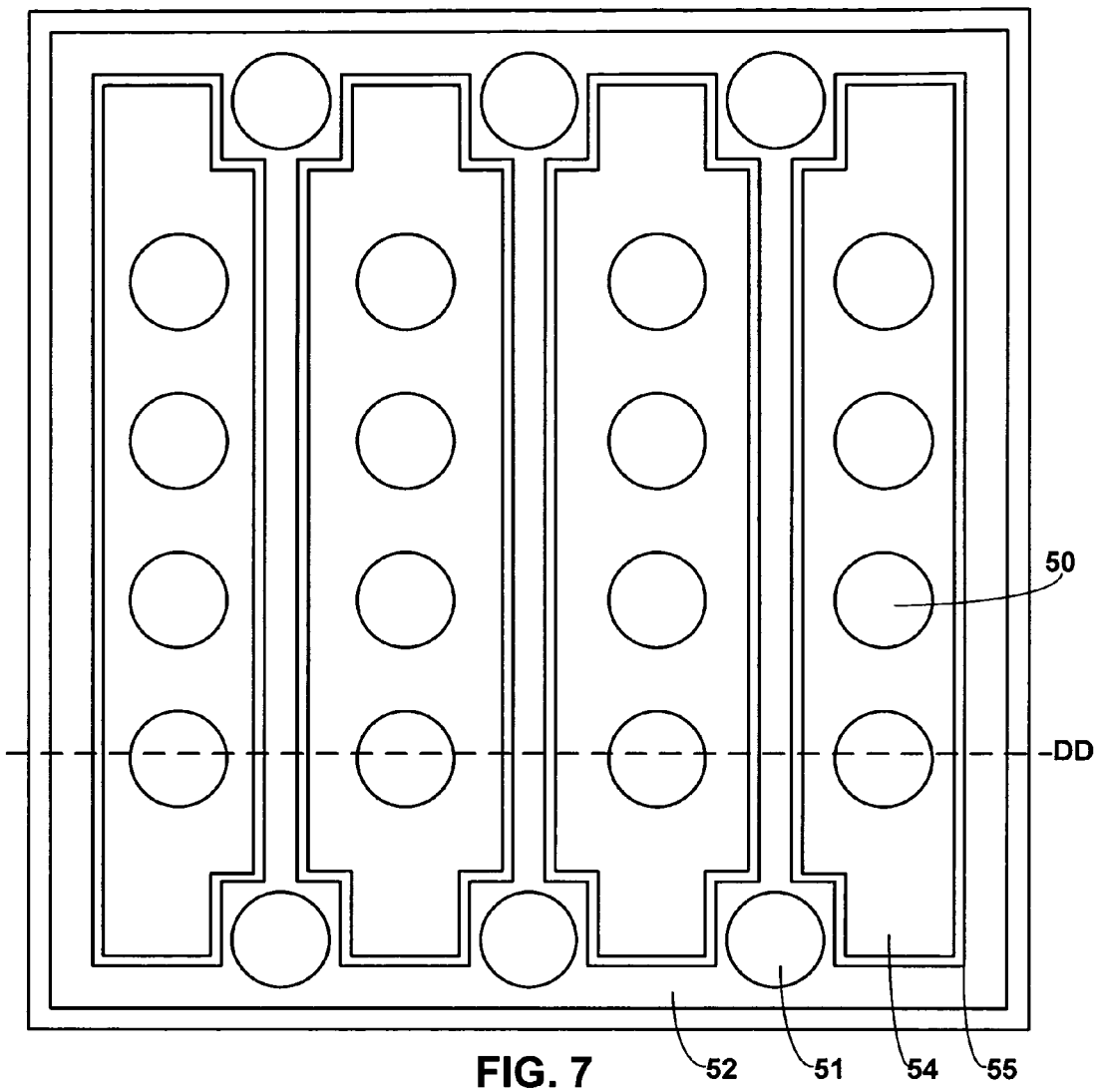
Figure 8:
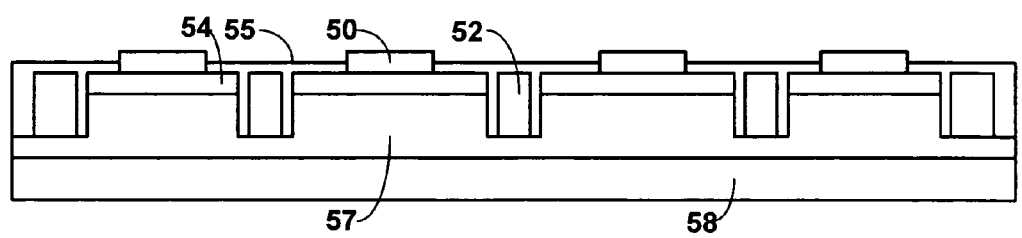

The semiconductor structures illustrated in FIGS. 3, 4, and 5 may be included in any configuration of a light emitting device. FIGS. 7 and 8 illustrate a flip chip device incorporating any of the structures of FIGS. 3, 4, and 5. FIG. 9 illustrates a thin film device incorporating the structure of FIGS. 3, 4, and 5.

FIG. 7 is a plan view of a large junction device (i.e. an area greater than or equal to one square millimeter). FIG. 8 is a cross section of the device shown in FIG. 7, taken along axis DD. FIGS. 7 and 8 also illustrate an arrangement of contacts that may be used with the semiconductor structure illustrated in FIGS. 3, 4, and 5. Semiconductor structure 57 may be grown on any suitable growth substrate 58, which may remain a part of the finished device. The active region of semiconductor structure 57 is separated into four regions separated by three trenches in which n-contacts 52 are formed. Each region is connected to a submount by four p-submount connections 50 formed on p-contact 54. N-contact 52 surrounds the four active regions. N-contact 52 is connected to a submount by six n-submount connections 51. The n- and p-contacts may be electrically isolated by an insulating layer 55.

FIG. 9 is a cross sectional view of a thin film device, a device from which the growth substrate is removed. The device illustrated in FIG. 9 may be formed by growing the semiconductor structure of FIGS. 3, 4, or 5 on a conventional growth substrate 58, bonding the device layers to a host substrate 70, then removing growth substrate 58. For example, n-type region 30 is grown over substrate 58. N-type region 30 may include optional preparation layers such as buffer layers or nucleation layers, and optional release layers designed to facilitate release of the growth substrate or thinning of the epitaxial layers after substrate removal. Light emitting region 31 is grown over n-type region 30, followed by p-type region 36. One or more metal layers 72, including, for example, ohmic contact layers, reflective layers, barrier layers, and bonding layers, are deposited over p-type region 36.

The device layers are then bonded to a host substrate 70 via the exposed surface of metal layers 72. One or more bonding layers (not shown), typically metal, may serve as compliant materials for thermo-compression or eutectic bonding between the epitaxial structure and the host substrate. Examples of suitable bonding layer metals include gold and silver. Host substrate 70 provides mechanical support to the epitaxial layers after the growth substrate is removed, and provides electrical contact to p-type region 36. Host substrate 70 is generally selected to be electrically conductive (i.e. less than about 0.1 Ωcm), to be thermally conductive, to have a coefficient of thermal expansion (CTE) matched to that of the epitaxial layers, and to be flat enough (i.e. with an root mean square roughness less than about 10 nm) to form a strong wafer bond. Suitable materials include, for example, metals such as Cu, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as AlN, compressed diamond, or diamond layers grown by chemical vapor deposition.

The device layers may be bonded to host substrate 70 on a wafer scale, such that an entire wafer of devices are bonded to a wafer of hosts, then the individual devices are diced after bonding. Alternatively, a wafer of devices may be diced into individual devices, then each device bonded to host substrate 70 on a die scale.

Host substrate 70 and semiconductor structure 57 are pressed together at elevated temperature and pressure to form a durable bond at the interface between host substrate 70 and metal layers 72, for example a durable metal bond formed between metal bonding layers (not shown) at the interface. The temperature and pressure ranges for bonding are limited on the lower end by the strength of the resulting bond, and on the higher end by the stability of the host substrate structure, metallization, and the epitaxial structure. For example, high temperatures and/or high pressures can cause decomposition of the epitaxial layers, delamination of metal contacts, failure of diffusion barriers, or outgassing of the component materials in the epitaxial layers. A suitable temperature range is, for example, about 200° C. to about 500° C. A suitable pressure range is, for example, about 100 psi to about 300 psi. Growth substrate 58 is then removed.

In order to remove a sapphire growth substrate, portions of the interface between substrate 58 and semiconductor structure 57 are exposed, through substrate 58, to a high fluence pulsed ultraviolet laser in a step and repeat pattern. The exposed portions may be isolated by trenches etched through the crystal layers of the device, in order to isolate the shock wave caused by exposure to the laser. The photon energy of the laser is above the band gap of the crystal layer adjacent to the sapphire (GaN in some embodiments), thus the pulse energy is effectively converted to thermal energy within the first 100 nm of epitaxial material adjacent to the sapphire. At sufficiently high fluence (i.e. greater than about 500 mJ/cm$^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers from substrate 58. The resulting structure includes semiconductor structure 57 bonded to host substrate 70. In some embodiments, the growth substrate may be removed by other means, such as etching, lapping, or a combination thereof.

After the growth substrate is removed, semiconductor structure 57 may be thinned, for example to remove portions of n-type region 31 closest to substrate 58 and of low material quality. The epitaxial layers may be thinned by, for example, chemical mechanical polishing, conventional dry etching, or photoelectrochemical etching (PEC). The top surface of the epitaxial layers may be textured or roughened to increase the amount of light extracted. A contact (not shown) is then formed on the exposed surface of n-type region 30. The n-contact may be, for example, a grid. The layers beneath the n-contact may be implanted with, for example, hydrogen to prevent light emission from the portion of light emitting region 31 beneath the n-contact. Secondary optics known in the art such as dichroics or polarizers may be applied onto the emitting surface to provide further gains in brightness or conversion efficiency.

Figure 10:
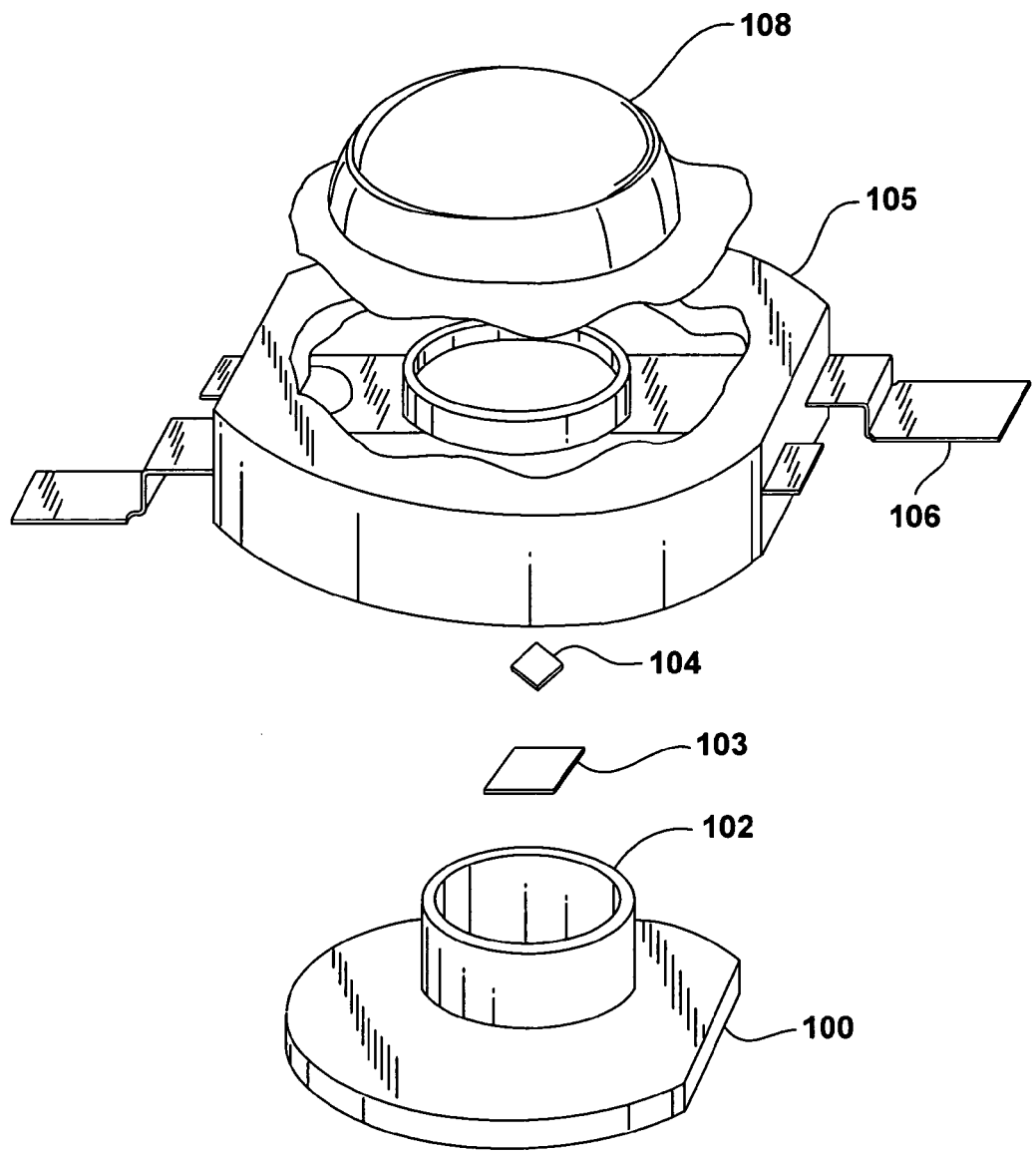

FIG. 10 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A semiconductor light emitting device comprising:
   an n-type region;
   an active region configured to emit light;
   a p-type region, wherein:
     the active region is disposed between the p-type region and the n-type region;
     the p-type region comprises at least one extension that extends into the active region;
     the p-type region has a top surface;
     the at least one extension into the active region extends from a first portion of the top surface; and
     a second portion of the top surface is without an extension into the active region; and
   a semiconductor layer formed over the second portion, the semiconductor layer being not intentionally doped or having a dopant concentration less than a dopant concentration in the p-type region.

2. The device of claim 1 wherein the active region comprises at least one III-nitride layer.

3. The device of claim 1 wherein the extension has a width between 250 nm and 1000 nm.

4. The device of claim 1 wherein the active region is adjacent to the n-type region, wherein the extension extends through the active region to within 100 nm of the n-type region.

5. The device of claim 1 wherein the extension has a depth between 200 nm and 1000 nm.

6. The device of claim 1 wherein the extension has a depth between 400 nm and 600 nm.

7. The device of claim 1 wherein the at least one extension is a first extension, the device further comprising a second extension that extends into the active region, wherein the first extension and the second extension are spaced between 0.3 micron and ten microns apart.

8. The device of claim 1 wherein the at least one extension is a first extension, the device further comprising a second extension that extends into the active region, wherein the first extension and the second extension are spaced between one micron and three microns apart.

9. The device of claim 1 wherein the semiconductor layer is GaN that is not intentionally doped.

10. The device of claim 1 further comprising:
    first and second contacts electrically connected to the n-type region and the p-type region;
    leads electrically connected to the first and second contacts; and
    a transparent cover disposed over the active region.

11. The device of claim 1 wherein the active region comprises at least two quantum well layers separated by at least one barrier layer.

12. The device of claim 11 wherein the extension penetrates at least one of the quantum well layers.

13. A semiconductor light emitting device comprising:
    an n-type region;
    an active region configured to emit light;
    a p-type region, wherein:
      the active region is disposed between the p-type region and the n-type region;
      the p-type region comprises at least one extension that extends into the active region;
      the p-type region has a top surface;
      the at least one extension into the active region extends from a first portion of the top surface; and
      a second portion of the top surface is without an extension into the active region; and
    a semiconductor layer formed over the second portion, the semiconductor layer having a band gap greater than a band gap in the p-type region.

14. The device of claim 13 wherein the semiconductor layer is AlGaN.

* * * * *